United States Patent

Misium et al.

(10) Patent No.: US 6,331,492 B2
(45) Date of Patent: *Dec. 18, 2001

(54) NITRIDATION FOR SPLIT GATE MULTIPLE VOLTAGE DEVICES

(75) Inventors: George R. Misium, Plano; Sunil V. Hattangady, McKinney, both of TX (US)

(73) Assignee: Texas Instruments Incorporated, Dallas, TX (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/215,909

(22) Filed: Dec. 18, 1998

Related U.S. Application Data

(60) Provisional application No. 60/070,174, filed on Dec. 31, 1997.

(51) Int. Cl.$^7$ .................................................. H01L 21/31
(52) U.S. Cl. ........................ 438/762; 438/275; 438/976; 438/981; 438/776
(58) Field of Search ................................ 438/976, 275, 438/981, 763, 776, FOR 205, FOR 401, FOR 490, FOR 494, 762; 257/392, 500

(56) References Cited

U.S. PATENT DOCUMENTS

| | | | |
|---|---|---|---|
| 5,502,009 | * | 3/1996 | Lin . |
| 5,558,718 | * | 9/1996 | Leung . |
| 5,851,475 | * | 12/1998 | Komvopoulos et al. . |
| 5,989,962 | * | 11/1999 | Holloway et al. . |
| 6,048,769 | * | 4/2000 | Chau . |
| 6,063,670 | * | 5/2000 | Lin et al. . |
| 6,110,842 | * | 8/2000 | Okuno et al. . |
| 6,225,167 | * | 5/2001 | Yu et al. . |
| 6,235,590 | * | 5/2001 | Daniel et al. . |

FOREIGN PATENT DOCUMENTS

| | | | |
|---|---|---|---|
| 3231456-A | * | 10/1991 | (JP) . |
| 2000311949-A | * | 11/2000 | (JP) . |
| 2000349164-A | * | 12/2000 | (JP) . |

* cited by examiner

*Primary Examiner*—George Fourson
*Assistant Examiner*—Michelle Estrada
(74) *Attorney, Agent, or Firm*—Jacqueline J. Garner; Wade James Brady, III; Frederick J. Telecky, Jr.

(57) ABSTRACT

A method is disclosed for making gate oxides on a silicon wafer surface for multiple voltage applications comprising the steps of growing an oxide layer (12) on a wafer (10) surface, exposing the surface of the oxide layer (12) to a nitrogen ion containing plasma to form a nitrided layer (22). Next, a photoresist layer (14) is deposited over a portion of the oxide layer (12) and the isolation (30), followed by etching of the exposed nitrided layer 22 and a portion of the oxide layer (12) to create a thinner silicon dioxide layer (32). The photoresist layer (14) is removed, the wafer (10) is cleaned and then the thinner silicon dioxide layer (32) is removed prior to a final oxidation step to form a thinner silicon dioxide layer (34) having a different thickness than the silicon dioxide layer (12).

25 Claims, 2 Drawing Sheets

NITRIDATION FOR SPLIT GATE MULTIPLE VOLTAGE DEVICES

This application claims benefit of Prov. No. 60/070,174 filed Dec. 31, 1997.

TECHNICAL FIELD OF THE INVENTION

The present invention relates in general to the field of integrated circuit manufacturing, and more particulary, to the formation of a thin film of nitride by using a nitrogen plasma to allow selectively etching of layers during the formation of integrated circuit components requiring multiple voltages.

BACKGROUND OF THE INVENTION

Without limiting the scope of the invention, its background is described in connection with the manufacture and formation of integrated circuit components for use in the creation of metal oxide semiconductors, as an example.

Heretofore, in this field, the major steps in silicon wafer fabrication have been the use of diffusion, metallization, etching and chemical clean-up steps to form semiconductors. The introduction of thermal oxidation of silicon, the use of lithographic photoresist techniques and etching of the various components using specific and nonspecific chemical agents brought forth the era of the planar processing of semiconductor integrated circuits.

More recently, complementary metal oxide silicon devices (CMOS) have been formed by the growth, deposition and etching of conductive and non-conductive layers taking advantage of chemical-vapor deposition (CVD) and ion implantation techniques. Chemical vapor deposition allowed for the selective and non-selective deposition of, e.g., etch protective overcoats, and of masking material.

In addition to CVD, other common ways for the deposition of conducting or insulation thin films has been the use of vacuum deposition or sputtering. Vacuum deposition and sputtering coat the wafer with a thin film which can, e.g., form an inorganic insulating material when heated in a reactive atmosphere. All three techniques can be used to achieve the deposition of a conducting or insulating layer. The deposited layers may also be used as sacrificial layers for use in the selective etching and formation of an integrated circuit component.

SUMMARY OF THE INVENTION

It has been found, however, that present methods for integrated circuit design and manufacture using silicon nitride layers account for a significant portion of the thermal budget during wafer processing. The thermal budget must be lowered to, e.g., enable scaling of high density integrated circuits. In addition, the large number of high temperature processing steps causes a significant impact on energy consumption and environmental impact of the current methods. The use of large amounts of chemical etching agents to remove these sacrificial layers can contribute to device failure (due, e.g., to mobile ions in the etching agents).

Furthermore, the deposition of thick silicon nitride layers can be required when deep etching of surrounding area is to be accomplished. Due to the thermal expansion of the layer during high temperature steps, mechanical stress resulting from the thick silicon nitride layer can lead to device failure.

What is needed is an improved method for the formation of a nitride layer, that does not require a high temperature deposition step. Also, a need has arisen for a nitride layer that can be selectively deposited without affecting a photoresist layer. Also needed, is a thinner layer (to lessen the mechanical stress otherwise caused within a thick layer at high temperatures) The layer, however, preferably still should be an effective barrier against mobile ions, and be easily removed in subsequent steps when used as a sacrificial layer.

The present invention provides an improved method for creating a nitrided silicon layer, or nitrided layer, which is resistant to oxide etching agents but does not require a high temperature deposition step. Using the present invention, a nitrided layer can be selectively deposited without affecting a photoreslst layer. The method of the present invention can also allow for the deposition of a thin layer that lessens the mechanical stress caused within the layer at high temperatures. The nitrided layer of the present invention can provide an effective barrier against mobile ions, and can be easily removed during subsequent steps when used as, e.g., a sacrificial layer.

More particulary, the present invention is directed to a method of making gate oxides on a silicon wafer surface, for multiple voltage applications, which includes the steps of growing a first oxide layer on at least first and second areas of the wafer surface and exposing the oxide areas to a nitrogen ion containing plasma, wherein the nitrogen ions convert a top layer of the exposed oxide area into a nitrided layer. Next a photoresist is patterned over the first area of the oxide layer, followed by partial etching of the second area of the oxide layer not protected by the photoresist. The photoresist is then stripped and the wafer cleaned prior to etching the remaining oxide from the second area. Etching of the remaining oxide from the second area exposes the wafer surface prior to the growth of a second oxide layer without exposing the bare silicon surface of the wafer to photoresist contaminants.

In one embodiment, a low temperature method for making gate oxides on a silicon wafer surface for dual voltage application comprises the steps of, obtaining a substrate and growing an oxide layer on the substrate. The oxide layer has a surface that is exposed to a nitrogen ion containing plasma, where the nitrogen ions form a nitrided layer on the oxide containing surface that can be used to protect layers underneath the nitrided layer from, for example, selective etching agents. In one embodiment, the portion of the second oxide layer that is etched down after removal of the photoresist is about 40 angstroms before final etching.

More particularly, the silicon oxide layer is maintained at a temperature below 600 degrees Celsius during nitridation of the oxide layer, and in one embodiment the temperature being room temperature. The nitrogen ion plasma can be created by a remote plasma.

The step of exposing the oxide containing surface to a nitrogen ion containing plasma can be further defined as occurring at between about 4 and 12 mTorr, and in one embodiment may be, for example, at about 4 mTorr. The step of exposing the oxide containing surface to a nitrogen ion containing plasma can also be defined as occurring for between about 10 to 90 seconds, in one embodiment the exposure occurring for about 60 seconds. In yet another embodiment, the oxide containing surface can be exposed to a nitrogen ion containing plasma at between about 1000 and 3000 watts. In one embodiment the nitrogen ion containing plasma can be created at about 2000 watts. In yet another embodiment the oxide surface is nitridated for 30 seconds in a 2000 W plasma. During the etching step, in one embodiment, the oxide is etched in a buffered hydrofluoric acid for 100 seconds. Additionally, a silicon layer, such as a polysilicon or amorphous silicon layer can be deposited on the oxide layer after the second oxide growth step. In yet another embodiment, the rate of formation of the nitrided oxide layer is dependent on a substrate bias, where the rate of nitrogen ion implantation into the silicon substrate depends on the voltage difference between the substrate and the plasma.

In yet another embodiment of the invention a low temperature method for making gate oxides on a silicon wafer surface for dual voltage applications comprises the steps of growing a first oxide layer on at least first and second areas of the surface, at least one of the areas is exposed to a nitrogen ion containing plasma, wherein the nitrogen ions convert a top layer of the exposed oxide area into a nitrided layer. A layer of photoresist is patterned over the first area of the oxide layer, followed by partial etching of the second area of the oxide layer not protected by the photoresist. Next, the photoresist is stripped and the silicon wafer cleaned to remove any photoresist contamination. The remaining oxide is etched from the second area of the oxide layer. The nitrided layer over the first area is etched and the wafer surface is then exposed to an oxidating environment in order to grow a silicon oxide over the first and second areas.

BRIEF DESCRIPTION OF THE DRAWINGS

For a more complete understanding of the features and advantages of the present invention, reference is now made to the detailed description of the invention along with the accompanying figures in which corresponding numerals in the different figures refer to corresponding parts and in which.

DETAILED DESCRIPTION OF THE INVENTION

While the making and using of various embodiments of the present invention are discussed in detail below, it should be appreciated that the present invention provides many applicable inventive concepts which can be embodied in a wide variety of specific contexts. The specific embodiments discussed herein are merely illustrative of specific ways to make and use the invention and do not delimit the scope of the invention.

The present invention is directed to a process for rendering a silicon dioxide layer resistant to etch chemistries used in integrated circuit component manufacturing, such as, hydrofluoric acid (HF). Remote plasma nitridation is used to selectively nitridate or nitridize a small layer of a silicon dioxide layer. The remote plasma nitridation may form, in situ, a "silicon nitride" which is to be understood as including a heterogenous mixture of silicon nitride ($Si_3N_4$) and silicon oxynitride ($SiNO_x$).

To prevent the nitridation by remote plasma deposition over specific locations on a silicon dioxide layer, a layer of lithographically developed photoresist can be placed over the silicon dioxide prior to nitridation to cover portions of the silicon dioxide. The photoresist prevents the interaction between the nitrogen ions created in the remote plasma and the silicon dioxide covered by the photoresist.

An alternative option is use remote plasma nitridation to cover the surface of the silicon dioxide layer with a nitrided layer prior to the application of a lithographic photoresist layer. The photoresist then serves as a masking layer to protect portions of the nitridized areas during a nitride removal etch.

Figure 1A:
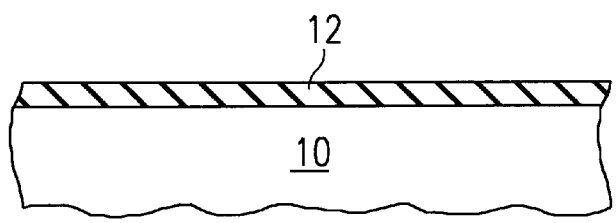
FIGS. 1a–d are illustrative cross-sections of one embodiment of the method of the present invention.
Figure 1B:
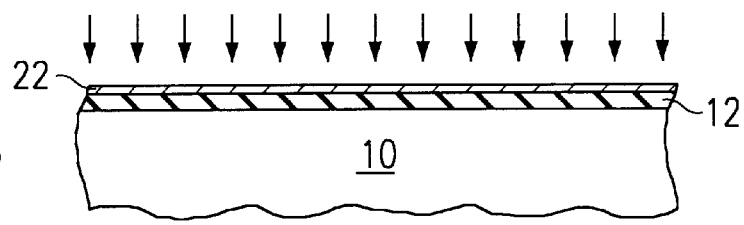
Figure 1C:
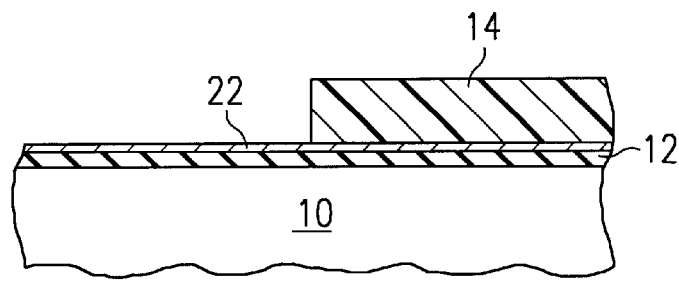

The general features of the method for rendering silicon dioxide resistant to HF chemistries by the remote plasma nitridation of the present invention are shown in FIGS. 1a–c. A portion of a wafer 10 on which a silicon dioxide layer 12 has been formed is illustrated FIG. 1a. The wafer 10 is typically a single crystal silicon substrate and can include circuit devices as well as wiring and insulating layers.

An method for rendering silicon dioxide resistant to HF chemistries by the remote plasma nitridation is shown in FIGS. 1a–c. The silicon dioxide layer 12 is grown over the wafer 10 by a high temperature processing step in an oxidating environment.

Figure 1D:
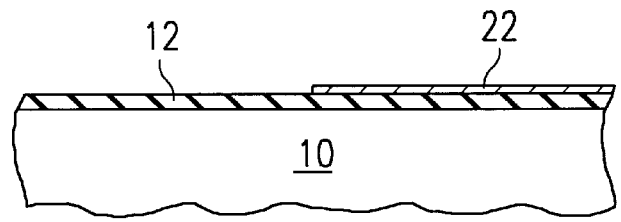

A nitrided layer 22 is created on the entire surface of the silicon dioxide layer 12 as shown in FIG. 1b. Next, a photoresist layer 14 is patterned to cover a portion of the nitrided layer 22 as shown in FIG. 1c. Next, etching chemicals that are capable of etching nitrided portions of the oxide, are applied to remove the exposed portion of the nitrided layer 22 over the silicon dioxide layer 12. When the photoresist layer 14 is removed, the portion of the nitrided layer 22 that was under the photoresist layer 14 still contains the nitrided surface that is resistant to HF chemistry etchants, while the exposed portion of the nitrided layer 22 was etched away, leaving bare oxide, as shown in FIG. 1d.

To etch the silicon dioxide layers, HF in various dilutions in water and often buffered with ammonium fluoride can be used. Silicon is etched in HF at a minuscule rate and thus provides an etch stop after an overlying oxide layer is etched. When using HF etchants the etching rate increases and decreases with etchant concentration. Increasing the temperature also increases the etch rate, with buffered solutions containing the etchants having a slightly higher activation energy.

Figure 2A:
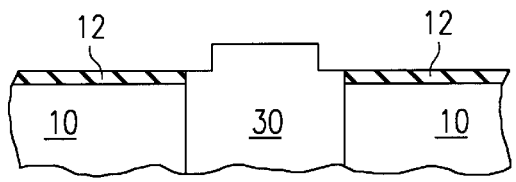
FIGS. 2a–f are illustrative cross-sections of another embodiment of the method of the present invention.
Figure 2B:
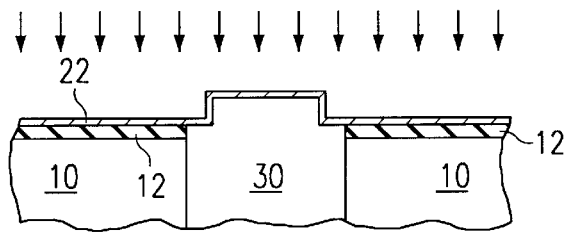
Figure 2C:
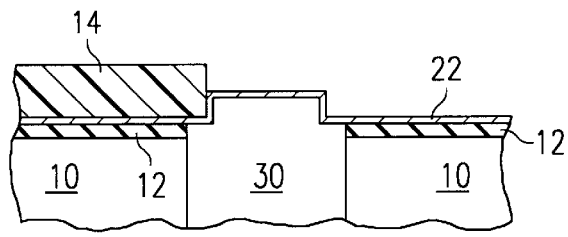

FIGS. 2a–f are illustrative cross-sections of one embodiment of a gate oxide structure and method made using the RPN process described in FIG. 1. An isolation 30 is made on a portion of a wafer 10 on which a silicon dioxide layer 12 has been grown. A nitrided layer 22 is formed on the entire surface of the silicon dioxide layer 12 and the isolation 30 as shown in FIG. 2b. The nitrided layer 22 can be created by, for example, a 30 second exposure to a remote plasma containing nitrogen ion created using 2000 watts of power. Next, a photoresist layer 14 is patterned to cover a portion of the nitrided layer 22 as shown in FIG. 2c. Before the photoresist layer 14 is patterned or before a subsequent etching step, a short anneal step can be used. One such anneal step can be a rapid thermal anneal carried out at 950 degrees Celsius for 30 seconds.

Figure 2D:
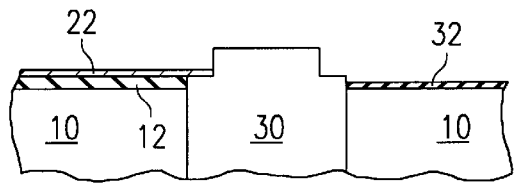

Next, the nitrided layer 22 is etched. Etching chemicals that are capable of etching the nitrided layer 22 on the oxide layer 12, (but that do not completely affect the photoresist layer 14), are applied to remove the exposed portion of the nitrided layer 22 over the silicon dioxide layer 12. As shown in FIG. 2d, the photoresist layer 14 has now been removed using, e.g., an ashing step followed by a cleaning step, while a thinner silicon dioxide layer 32 remains after the nitrided layer 22 that was covering it has been etched away. The wafer 10 can now be cleaned to remove all photoresist 14 and any mobile ions that could have become associated with the bare silicon on wafer 10. In an alternative embodiment, silicon dioxide layer 12 can also be selectively etched to a small thickness, such as a 40 angstrom thickness over the wafer 10.

Figure 2E:
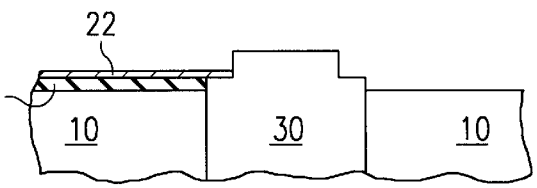

In FIG. 2e the thinner silicon dioxide layer 32 has been etched away to expose silicon wafer 10. The nitride layer 22 can also be etched away, either prior to, concurrently with, or after, the etching of thinner silicon dioxide layer 32. Etching conditions can vary, but in one example can be a 100 second exposure to buffered hydrofluoric acid. A partial etching step may also be added for 155 seconds in BHF.

Figure 2F:
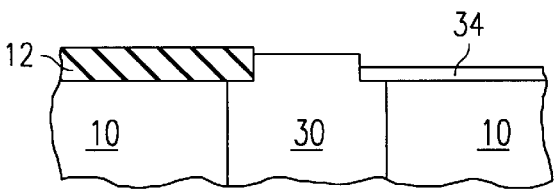

Next, as shown in FIG. 2f the nitrided layer 22 has been removed and a second silicon dioxide layer 34 is grown, while at the same time the remaining silicon dioxide layer 12 is further grown. Further oxide growth yields a thicker silicon dioxide layer 12 and a new thinner silicon dioxide layer 34, having different thicknesses for use in dual voltage gates. Alternatively, the nitrided layer 22 does not have to be removed and only a thin silicon dioxide layer 34 can be grown from wafer 10 to yield the dual thickness silicon oxide for dual voltage gates depicted in FIG. 2f.

Unlike dual or multiple gate-oxide processes of the prior art, the process of the present invention prevents the exposure of the wafer 10 to contaminants from the photoresist layer 14 and the etch chemicals that can deposit reactive radicals. These reactive radicals, also known as mobile ions, decrease the reliability of the device by contaminating subsequent layers or structures. The photoresist layer 14 can be removed with a standard piranha or nanostrip, followed by a gate clean-up step of HF and SC1.

Alternatively, additional layers can be deposited and protected by the remote plasma nitridation and photoresist process to have more than two layers having different thicknesses, as is found in electrically erasable programmable read-only memory (EEPROM) cells and non-volatile memory applications. Additional layers, such as polysilicon and amorphous silicon layers (not depicted) can be deposited and protected using the remote plasma nitridation process disclosed herein. Furthermore, the nitridation step may introduce nitrogen in the oxide-silicon interface, thereby improving device reliability.

Silicon nitride can be wet etched, for example, with either HF solutions or with hot phosphoric acid. Phosphoric acid is the "standard" wet nitride etch. In it, the nitride can etch more than 40 times as fast as CVD oxide, which is often used as a mask. The selectivity decreases at high temperatures, but in order to have useful etch rates, high-temperature boiling concentrated $H_3PO_4$ generally is used. For example, 91.5% $H_3PO_4$ boils at 180 degrees Celsius, etches high-temperature nitride at approximately 100 Angstroms/minute, and etches CVD oxide at about 10 Angstroms/minute. Under these same conditions, single-crystal silicon etches about 30% as fast as CVD oxide.

The remote plasma nitridation used in the invention can be carried out as follows. Nitridation can be performed at, for example, room-temperature by exposing a gate oxide to a short, high-density, remote helicon-based nitrogen discharge. Process conditions for the nitridation can be, for example, a process pressure of 2.7 to 12 mTorr, an input plasma power of 500 to 3000 watts, and a durations of 3 to 90 seconds. In one embodiment of the present invention, a high density plasma discharge from a helicon-based nitrogen discharge is created using a plasma power of 1000 to 3000 watts. A power of 2000 watts can also be used. The chamber pressure can also be from 4 to 12 mTorr. Finally, a nitridation exposure time can be from about 10 to 90 seconds. In one embodiment, the nitridation exposure time was 20 seconds. The wafer can be supported on a ceramic ring (electrically floating) or, alternatively, on an electrostatic chuck (capacitively coupled to ground).

Post-nitridation annealing in an inert or low partial-pressure oxygen ambient can be performed using a furnace or rapid-thermal annealing. In one embodiment, the post-nitridation anneal is conducted in a controlled environment having, e.g., $N_2$, in an ambient or dilute ambient oxidation environment. Next, a rapid thermal anneal at 1000 degrees Centigrade for 60 seconds is conducted.

Depth profiling analysis can be performed on nilrided oxides with or without a 10 nm a-Silicon dioxide cap layer. Dynamic SIMS analysis can be performed using 1 keV Cs primary ion bombardment. Monitoring of CsSi+, CsO+, and CsN+ ions can be conducted to track [SI], [N] concentrations, respectively.

Separately, Time-of-flight SIMS (TOFSIMS), analysis can be performed using a 2 keV Ga+ primary ion bombardment, achieving 0.5–0.7 nm depth resolution within the top 5 nm of the dielectric film. Gallium, for example, can be selected as a primary ion source to minimize the pre-equilibrium effect nominally associated with Cs+ and O+ ion sources, allowing meaningful analysis of N and O concentrations from the top five angstroms. $Si_xN$+ and $Si_xO$+ ions can be used to track [N] and [O] as a function of depth. While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of making gate oxides on a silicon wafer surface for multiple voltage applications, comprising the steps of:

forming a first oxide layer on at least first and second exposed areas of a silicon wafer surface to provide first and second exposed oxide areas;

converting a top layer of each of said first and second exposed oxide areas into first and second nitrided layer by exposing said first and second oxide areas to a nitrogen ion-containing plasma;

patterning a layer of photoresist over said oxide areas and said first nitrided layer on said one of said oxide areas;

etching areas of the oxide layer and the nitrided layer thereover which are not beneath the pattern of photoresist in accordance with said pattern;

then stripping said photoresist;

then etching the remaining oxide from said second area to expose the wafer surface of said second area; and oxidizing said exposed second area to grow a second oxide layer thicker than said first oxide layer.

2. The method of claim 1, wherein the step of exposing said first and second oxide areas to a nitrogen ion containing plasma occurs at a temperature below 600 degrees Celsius.

3. The method of claim 2, wherein said temperature is room temperature.

4. The method of claim 1, wherein said nitrogen ion containing plasma is a plasma created remote from said silicon wafer.

5. The method of claim 1, wherein the step of etching said second area comprises etching the exposed portion of said second area to a thickness of about 40 Angstroms.

6. The method of claim 1, further comprising the step of:

depositing a polysilicon layer over said first and second oxide areas.

7. The method of claim 1, wherein the step of exposing said oxide areas to a nitrogen ion containing plasma is further defined as occurring at between about 4 and 12 mTorr.

8. The method of claim 1, wherein the step of exposing said oxide areas to a nitrogen ion containing plasma is further defined as occurring at about 4 mTorr.

9. The method of claim 1, wherein the step of exposing said oxide areas to a nitrogen ion containing plasma is further defined as occurring for between about 10 to about 90 seconds.

10. The method of claim 1, wherein the step of exposing said oxide areas to a nitrogen ion containing plasma is further defined as occurring for about 60 seconds.

11. The method of claim 1, wherein said step of exposing said oxide containing surface to a nitrogen ion containing plasma said plasma is further defined as being created at between about 1000 and 3000 watts.

12. The method of claim 1, exposing said oxide areas to a nitrogen ion containing plasma is further defined as being created at about 2000 watts.

13. A low temperature method for making gate oxides on a silicon wafer surface for multiple voltage applications comprising the steps of:
  growing a first oxide layer on at least first and second areas of a silicon wafer surface;
  converting a top layer of said first oxide layer on said at least first and second areas of said silicon wafer surface into first and second nitrided areas by exposing said first and second oxide areas to a nitrogen ion containing plasma;
  patterning a layer of photoresist over said oxide layer and said nitrided area thereon over said first oxide area;
  partially etching said nitrided area over said oxide in said second area and the oxide layer thereunder which is not protected by said photoresist;
  stripping said photoresist;
  etching the remaining oxide from said second area to expose the wafer surface at said second area of the oxide layer not protected by photoresist;
  etching the first nitrided area; and
  exposing the wafer surface to an oxidizing environment to further oxidize said first and oxidize said second oxide areas to provide an oxide layer over said first area thicker than said oxide layer over said second area.

14. The method of claim 13, wherein the step of exposing said first and second oxide areas to a nitrogen ion containing plasma occurs at a temperature below 600 degrees Celsius.

15. The method of claim 14, wherein said temperature is room temperature.

16. The method of claim 13, wherein said nitrogen ion containing plasma is a plasma created remote from said silicon wafer.

17. The method of claim 13, wherein the step of etching said second area comprises etching the exposed portion of said second area to a thickness of about 40 Angstroms.

18. The method of claim 13, further comprising the step of:
  depositing a polysilicon layer over said first and second oxide areas.

19. The method of claim 13, wherein the step of exposing said oxide areas to a nitrogen ion containing plasma is further defined as occurring at between about 4 and 12 mTorr.

20. The method of claim 13, wherein the step of exposing said oxide areas to a nitrogen ion containing plasma is further defined as occurring at about 4 mTorr.

21. The method of claim 13, wherein the step of exposing said oxide areas to a nitrogen ion containing plasma is further defined as occurring for between about 10 to about 90 seconds.

22. The method of claim 13, wherein the step of exposing said oxide areas to a nitrogen ion containing plasma is further defined as occurring for about 60 seconds.

23. The method of claim 13, wherein said step of exposing said oxide containing surface to a nitrogen ion containing plasma said plasma is further defined as being created at between about 1000 and 3000 watts.

24. The method of claim 13, exposing said oxide areas to a nitrogen ion containing plasma is further defined as being created at about 2000 watts.

25. The method of claim 13, wherein said substrate is further defined as having a substrate bias, said substrate bias affecting the rate of formation of said nitrided layer.

* * * * *